(12) United States Patent
Chen et al.

(10) Patent No.: US 12,374,530 B2
(45) Date of Patent: Jul. 29, 2025

(54) SEMICONDUCTOR PROCESSING APPARATUS FOR GENERATING PLASMA

(71) Applicant: Taiwan Semiconductor Manufacturing Co., Ltd., Hsinchu (TW)

(72) Inventors: Chien-Hsiang Chen, Hsinchu (TW); Ching-Horng Chen, Hsinchu County (TW); Yen-Ji Chen, Hsinchu (TW); Cheng-Yi Huang, Hsinchu (TW); Chih-Shen Yang, Yunlin County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 1037 days.

(21) Appl. No.: 16/928,008

(22) Filed: Jul. 14, 2020

(65) Prior Publication Data
US 2021/0066054 A1    Mar. 4, 2021

Related U.S. Application Data

(60) Provisional application No. 62/893,131, filed on Aug. 28, 2019.

(51) Int. Cl.
| H01L 21/306 | (2006.01) |
| H01J 37/32 | (2006.01) |
| H01L 21/67 | (2006.01) |
| H05K 9/00 | (2006.01) |

(52) U.S. Cl.
CPC ...... *H01J 37/32651* (2013.01); *H01J 37/321* (2013.01); *H01J 37/3211* (2013.01); *H01L 21/67069* (2013.01); *H05K 9/0049* (2013.01); *H01J 2237/334* (2013.01)

(58) Field of Classification Search
CPC . H01J 37/32651; H01J 37/321; H01J 37/3211
See application file for complete search history.

(56) References Cited

U.S. PATENT DOCUMENTS

| 5,449,433 A * | 9/1995 | Donohoe | H01J 37/321 438/719 |
| 6,530,342 B1 * | 3/2003 | Johnson | H01J 37/32458 118/723 R |
| 2002/0129903 A1 * | 9/2002 | Davis | H01J 37/32082 156/345.48 |
| 2004/0194890 A1 * | 10/2004 | Moroz | H01J 37/32082 156/345.48 |
| 2011/0297320 A1 * | 12/2011 | Sakka | H01J 37/3211 156/345.48 |

(Continued)

FOREIGN PATENT DOCUMENTS

WO    2013099372 A1 *  7/2013    ............ C23F 4/00

*Primary Examiner* — Luz L Alejandro Mulero
(74) *Attorney, Agent, or Firm* — JCIPRNET

(57) ABSTRACT

A Faraday shield, a semiconductor processing apparatus, and an etching apparatus are provided. The Faraday shield includes a plurality of conductive slices and a spacer interposed between adjacent two of the conductive slices to electrically isolate the adjacent two of conductive slices from one another. The conductive slices are separately arranged aside one another and oriented along a circumference of the Faraday shield. A coil is wound around the circumference of the Faraday shield.

20 Claims, 10 Drawing Sheets

(56) References Cited

U.S. PATENT DOCUMENTS

| | | | | |
|---|---|---|---|---|
| 2012/0160806 A1* | 6/2012 | Godyak | ................... | H05H 1/46 |
| | | | | 216/61 |
| 2012/0267050 A1* | 10/2012 | Sakka | ................ | H01J 37/32119 |
| | | | | 156/345.39 |
| 2014/0353142 A1* | 12/2014 | Nakagawa | ................ | C23F 4/00 |
| | | | | 204/298.31 |
| 2019/0108974 A1* | 4/2019 | Rogers | ................. | H01J 37/3211 |

* cited by examiner

SEMICONDUCTOR PROCESSING APPARATUS FOR GENERATING PLASMA

CROSS-REFERENCE TO RELATED APPLICATION

This application claims the priority benefit of U.S. provisional application Ser. No. 62/893,131, filed on Aug. 28, 2019. The entirety of the above-mentioned patent application is hereby incorporated by reference herein and made a part of this specification.

BACKGROUND

Plasma technology is widely used in semiconductor manufacturing processes. For example, plasma etching is one etching technique that is commonly used for selective processing, forming fine-pitched pattern, photoresist stripping, or the like. A radio frequency (RF) coil may be utilized in the plasma etching system for supplying plasma-creating power, and plasma generated in the plasma etching system may react with a surface of a target (e.g., a wafer, any layer overlying the wafer, etc.) to create a byproduct that is removed, thereby yielding an etched surface of the target. As semiconductor devices are being scaled down, the complexity of integrated circuit manufacturing is increased. Although the existing technologies have been adequate for their intended purposes, they have not been satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
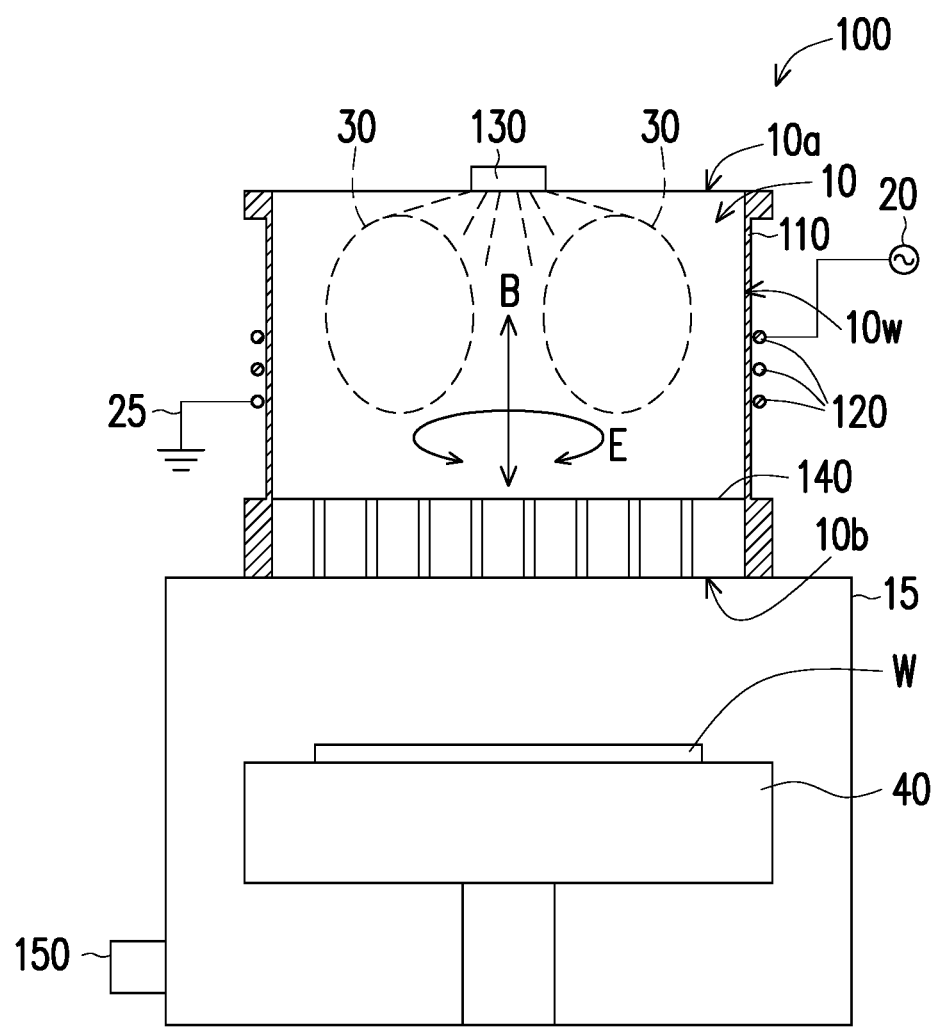
FIG. 1 is a schematic cross-sectional view illustrating a semiconductor processing apparatus according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic cross-sectional view illustrating a semiconductor processing apparatus according to some embodiments of the present disclosure. Referring to FIG. 1, a semiconductor processing apparatus 100 includes an assembly utilized for generating plasma. In some embodiments, the semiconductor processing apparatus 100 is configured to perform plasma etching on a semiconductor workpiece. Alternatively, the semiconductor processing apparatus 100 is used to performed plasma processes including plasma enhanced chemical vapor deposition, sputtering, ashing, cleaning, etc.

For example, the semiconductor processing apparatus 100 includes a shield 110 surrounding a plasma-generating chamber 10, a coil 120 disposed around the shield 110 and connected to a power source 20, and a gas inlet 130 disposed at the upstream side 10*a* of the plasma-generating chamber 10. In some embodiments, the coil 120 is coupled to the power source 20 and may have other end coupled to a ground 25. For example, the ground 25 is a grounding tab attached to a portion of the chamber lid, or some other conductor to ground. In some embodiments, the power source 20 provides radio frequency (RF) power to the coil 120 at a desired frequency to generate the RF current flowing through the coil 120. The plasma density may be controlled by the applied RF current or power delivered to the coil 120. An electric field may be generated in the plasma-generating chamber 10 based on time variation of the magnetic fields. The RF current generates the axial magnetic field B and the resultant azimuthal electric field E as indicated in FIG. 1.

The high voltage applied to the coil 120 may yield the electrostatic field along the coil 120. For example, the electric field generated by the coil 120 ionizes the gas flowing from the gas inlet 130 to produce the plasma 30 in the plasma-generating chamber 10. It should be noted that the gas inlet 130 including pipelines and gas supply system is simplified in FIG. 1 for ease of illustration, and the gas (e.g., the inert gas, the processing gas, or the like) may be supplied from the gas inlet 130 for plasma generation. The term "plasma" used herein may refer to plasma products including ions, electrons, and neutral species, or the like. In some embodiments, generation of the plasma 30 is confined to the plasma-generating chamber 10 surrounded by the coil 120.

In some embodiments, the shield 110 is disposed on an exterior wall 10w of the plasma-generating chamber 10 and located between the plasma-generating chamber 10 and the coil 120. The shield 110 may be referred to as a Faraday shield which plays an important role in optimizing the RF power efficiency. The improved RF power efficiency may facilitate producing high density plasmas in the plasma-generating chamber 10 for semiconductor processing, thereby increasing the productivity and the yield of the semiconductor manufacturing process. In some embodiments, the shield 110 has the shape of a circular cylindrical shell. In other embodiments, the shield 110 is formed in shape of hollow square column. The shield 110 may take various forms, and may be built in a variety of ways as will be described later in other embodiments. In the case of the shield 110 having a cylindrical shape, the coil 120 is wound into a ring shape, or wound in a helical manner to surround the shield 110. It should be noted that other types of the coil may be used in other embodiments, including without limitation, spiral coils in a flat plane or above the plasma-generating chamber 10, or other coils for inductively coupling power into the plasma-generating chamber 10.

In some embodiments, the semiconductor processing apparatus 100 includes a screen 140 disposed at the downstream side 10b (e.g., opposing to the upstream side 110a) of the plasma-generating chamber 10 for preventing the workpiece W directly exposed to the plasma 30. The screen 140 may be an ion screen and/or an ultraviolet (UV) light screen. For example, the plasma 30 flows through the screen 140, so that electrons in the plasma 30 may be repelled and positive ions may be collected. In some embodiments, the screen 140 serves as a baffle so that no energetic photons (e.g., UV light) can pass through the screen 140. In some embodiments, the screen 140 is separated the plasma-generating chamber 10 from a processing chamber 15. For example, below the plasma-generating chamber 10 is the processing chamber 15 in which is contained the workpiece W for processing.

In some embodiments, the plasma 30 passes through the screen 140 to the processing chamber 15 and reacts with a surface of the workpiece W to create a byproduct that is removed, thereby yielding an etched surface of the workpiece W. Any variety of other processes may be performed according to other embodiments. For example, the workpiece W is a semiconductor wafer or includes a semiconductor substrate on which a layer (e.g., a dielectric layer, a conductive layer, a semiconductor material layer, etc.) is formed. In some embodiments, a chuck 40 (e.g., an electrostatic chuck or the like) is provided in the processing chamber 15 for supporting the workpiece W when present. In some embodiments, a gas exhaust 150 is coupled to the processing chamber 15, and at least a portion of the reaction products are exhausted along with used reactant gas form the processing chamber 15 through the gas exhaust 150. It should be noted that the gas exhaust 150 including pipelines and pump or other exhaust system is simplified in FIG. 1 for ease of illustration.

Figure 2:
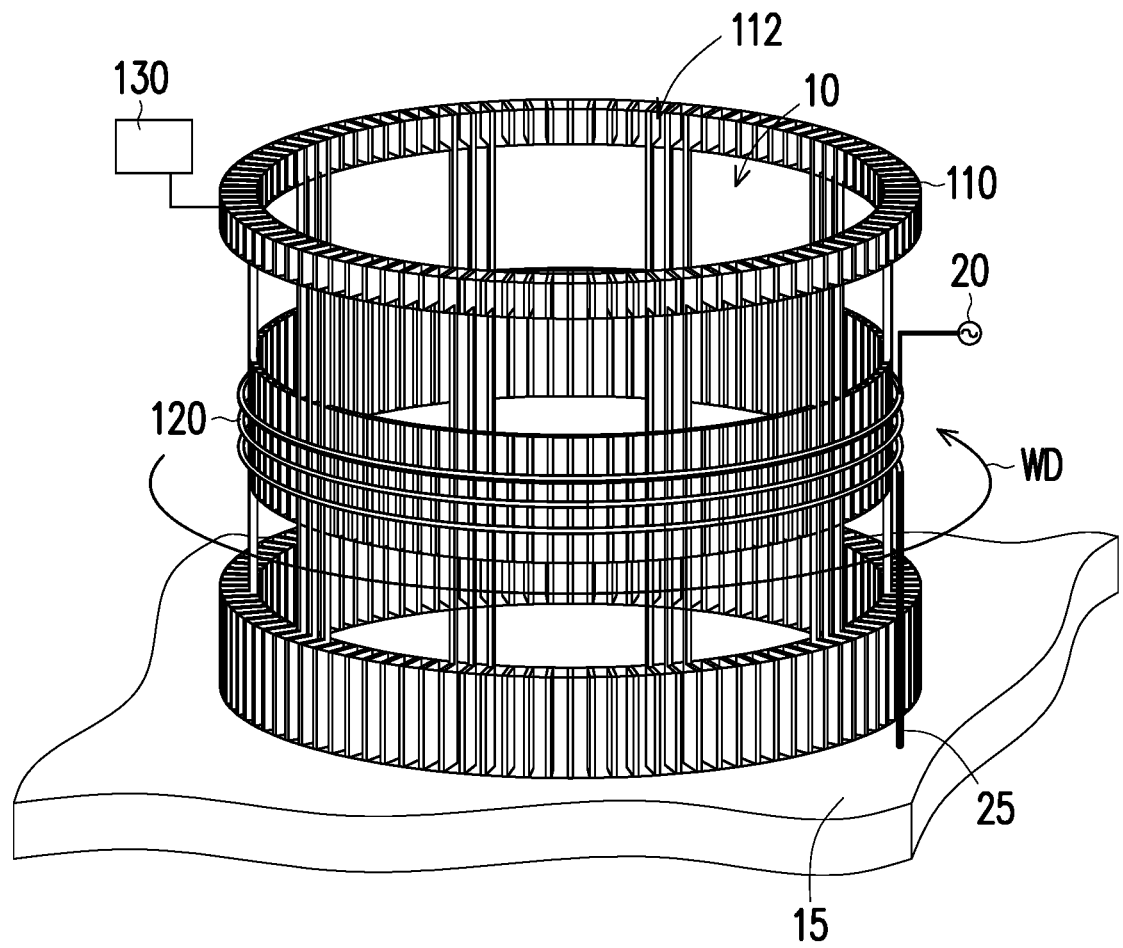
FIG. 2 is a schematic perspective view illustrating a state that a shield is installed according to some embodiments of the present disclosure.
Figure 3A:
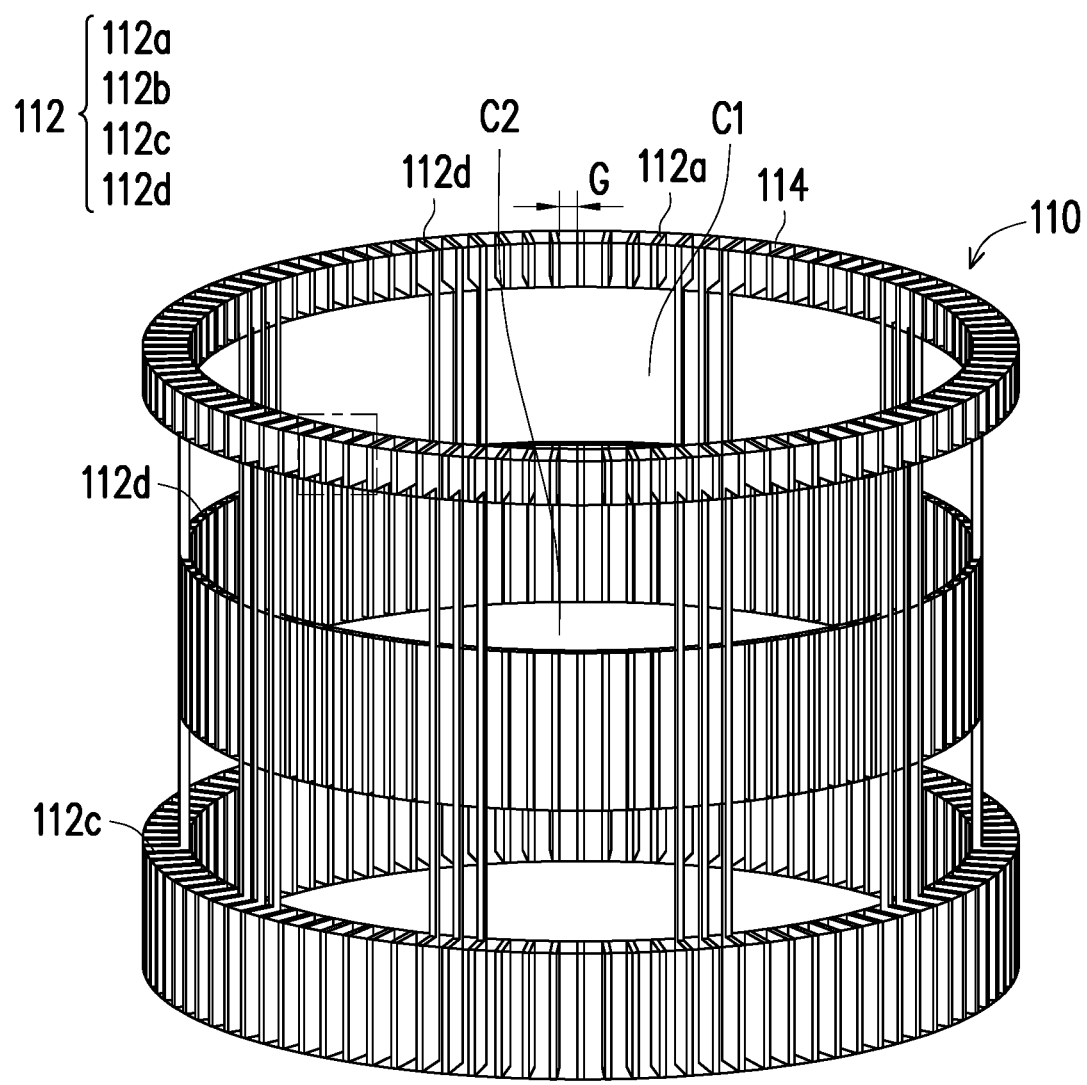
FIG. 3A is a schematic perspective view illustrating a shield of a semiconductor processing apparatus according to some embodiments of the present disclosure.
Figure 3B:
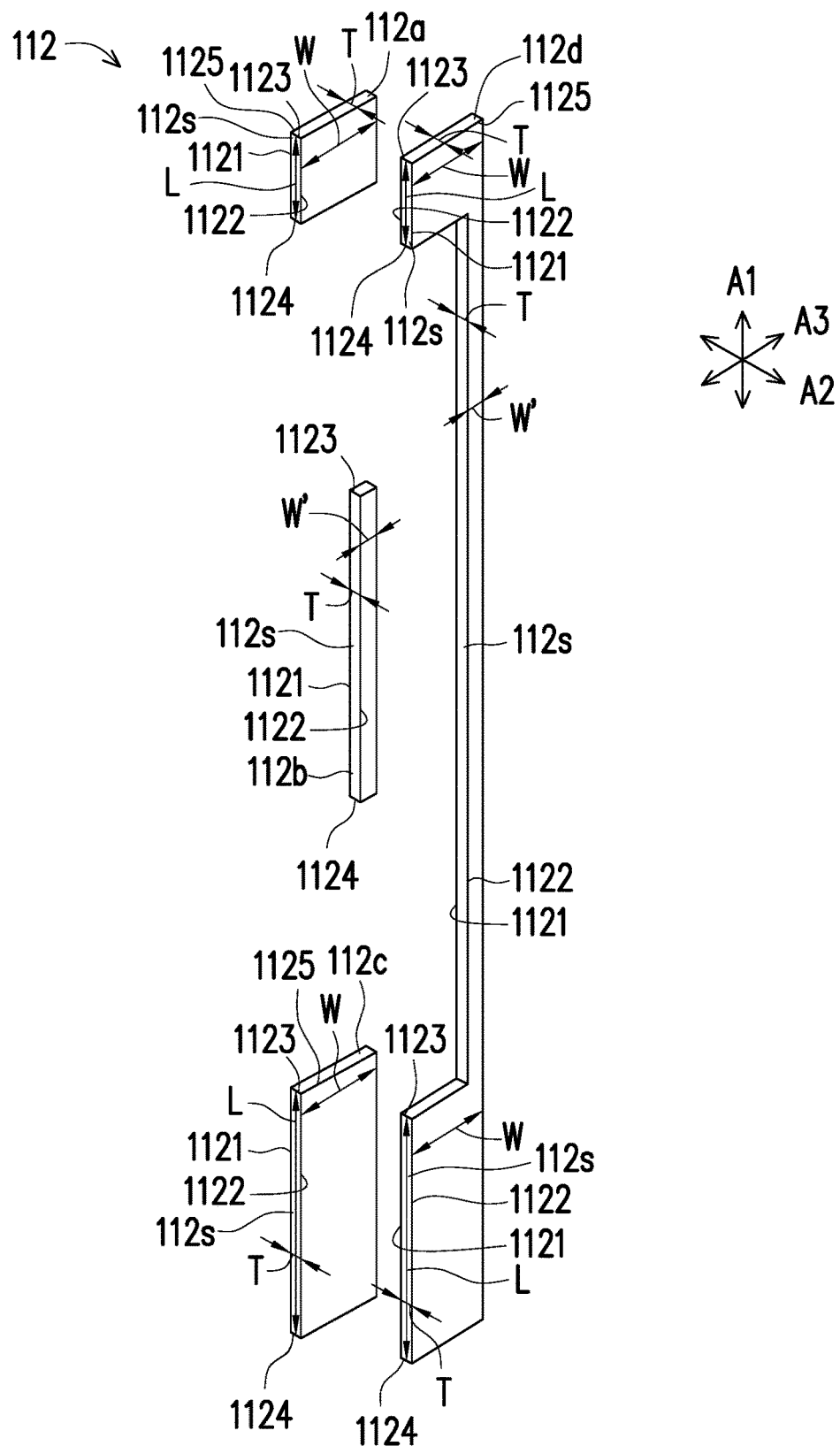
FIG. 3B is a schematic enlarged view illustrating conductive slices of a shield according to some embodiments of the present disclosure.
Figure 4:
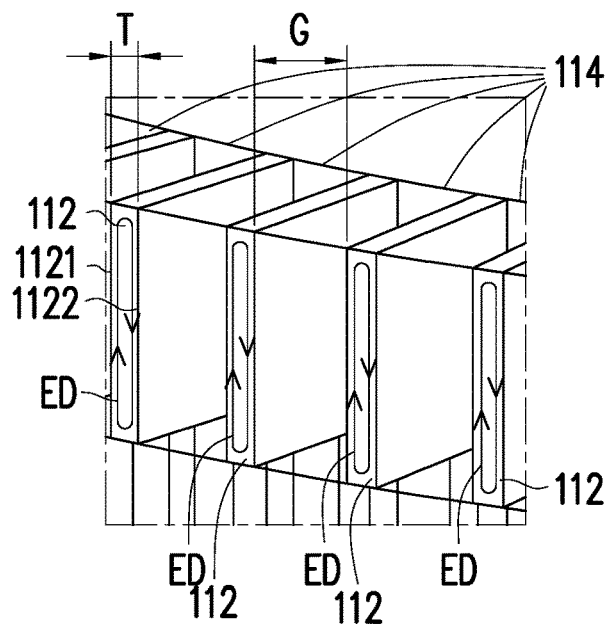
FIG. 4 is a schematic enlarged view illustrating a dashed box outlined in FIG. 3A according to some embodiments of the present disclosure.
Figure 5:
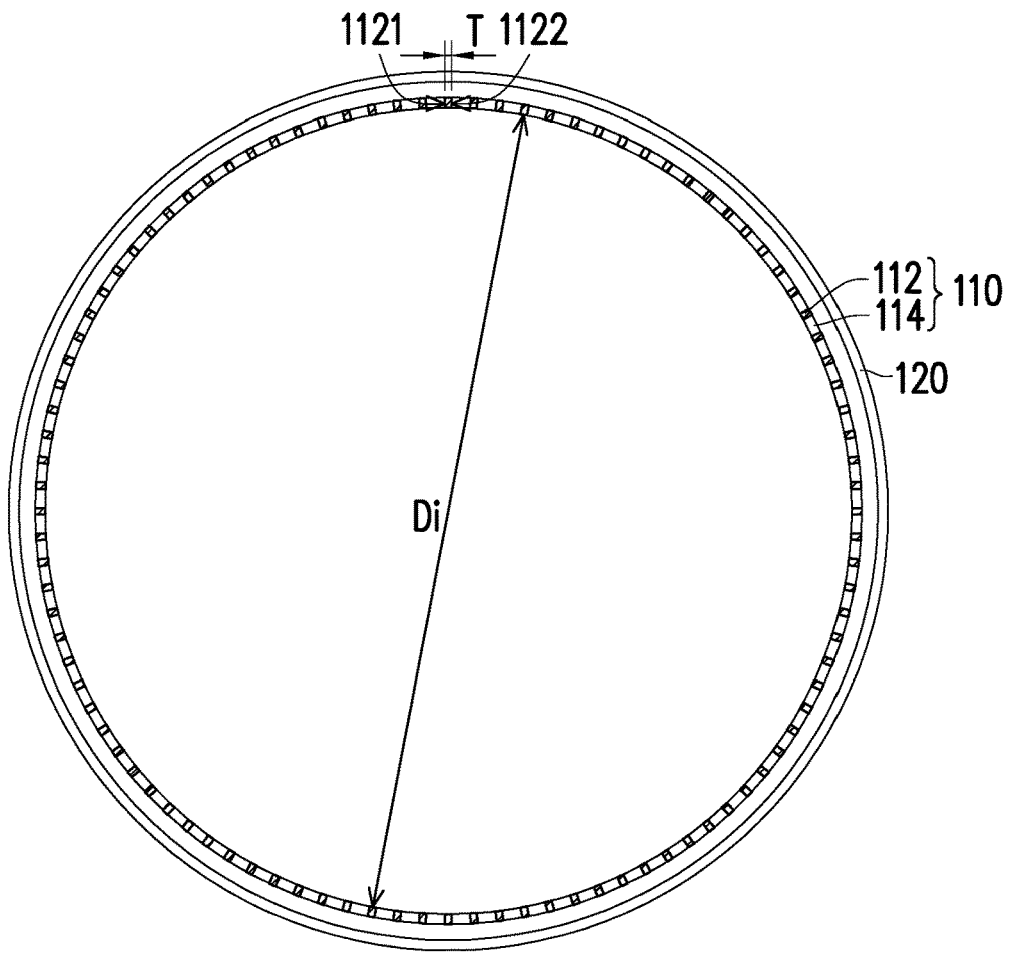
FIG. 5 is a schematic top view illustrating a shield and a coil of a semiconductor processing apparatus according to some embodiments of the present disclosure.

FIG. 2 is a schematic perspective view illustrating a state that a shield is installed according to some embodiments of the present disclosure, where some elements of the semiconductor processing apparatus are omitted for ease of illustration, FIG. 3A is a schematic perspective view illustrating a shield of a semiconductor processing apparatus according to some embodiments of the present disclosure, FIG. 3B is a schematic enlarged view illustrating conductive slices of a shield according to some embodiments of the present disclosure, FIG. 4 is a schematic enlarged view illustrating a dashed box outlined in FIG. 3A according to some embodiments of the present disclosure, and FIG. 5 is a schematic top view illustrating a shield and a coil of a semiconductor processing apparatus according to some embodiments of the present disclosure, where the number of conductive slices of the shield is shown for illustrative purposes.

With reference to FIG. 2, FIG. 3A, FIG. 3B, and FIG. 4, the shield 110 includes a plurality of conductive slices 112 oriented along the circumference of the plasma-generating chamber 10 and substantially parallel to one another in a winding direction WD of the coil 120. It is understood that although the winding direction WD is illustrated as a counter-clockwise direction, the coil may be wound around the shield in a clockwise direction in other embodiments. In some embodiments, the conductive slices 112 are spaced and axially extending segments surrounded by the coil 120. For example, as shown in FIG. 3B, the respective conductive slices 112 have a length along a first axis A1 which is perpendicular to a second axis A2 that the coil 120 is disposed. For example, the first axis A1 is the Z axis. The conductive slices 112 may be any material or combination of materials provided they are conductive. For example, the material of the conductive slices 112 includes aluminum, iron, copper, silicon steel sheet, silver, gold, platinum, metallic alloys, combination of these, or the like.

In some embodiments, each of the conductive slices 112 has facets 112s substantially parallel to the exterior wall 10w of the plasma-generating chamber 10 (labelled in FIG. 1). Each facet 112s of the respective conductive slice 112 may have a facet width defined by two side edges (1121 and 1122) extending along the first axis A1, where the first axis A1 is substantially perpendicular to the second axis A2 in which the coil 120 is wound. The facet width may be viewed as the thickness T of the respective conductive slice 112. In some embodiments, two opposing facets 112s, which are respectively proximal to and distal to the exterior wall 10w of the plasma-generating chamber 10, have approximately the same facet width. For example, the top surface or the bottom surface of the respective conductive slice 112 is formed in the shape of a rectangular (or square). In other embodiments, the opposing facets 112s have different facet widths. For example, the facet width of the facet 112s proximal to the exterior wall 10w of the plasma-generating chamber 10 is greater than the facet width of the facet 112s distal to the exterior wall 10w of the plasma-generating chamber 10. For example, the top surface or the bottom surface of the first type of conductive slice 112 is formed in the shape of a trapezoid which is tapered in a direction away from the exterior wall 10w of the plasma-generating chamber 10. Alternatively, the facet width of the facet 112s distal to the exterior wall 10w of the plasma-generating chamber 10 is greater than the facet width of the facet 112s proximal to the exterior wall 10w of the plasma-generating chamber 10. For example, the top surface or the bottom surface of the respective conductive slice 112 is formed in the shape of a trapezoid which is tapered toward the exterior wall 10w of the plasma-generating chamber 10.

It is understood that the magnetic field intersecting the shield 110 produces eddy currents, and the eddy currents may consume power which produces losses due to a resistance of the shield 110. For example, during operation, each of the conductive slices 112 including the side edges 1121 and 1122 forms therebetween an eddy current as indicated by arrow ED. It is appreciated that the eddy current losses of the shield 110 are proportional to the square of the thickness T of the shield 110. It follows from the eddy current loss formula that the reduction of the eddy current losses is effective if the thickness T of the respective conductive slice 112 is small. For example, losses due to eddy currents may be minimized by a discontinuous or sliced shield, thereby efficiently generating the magnetic fields. In some embodiments, the thickness T of the respective conductive slice 112 ranges from about 0.01 mm to about 10 mm. It should be noted that the thickness T of the respective conductive slice 112 may be selected depending on the technique(s) that is employed to fabricate the shield 110 and/or the process requirements of the semiconductor processing apparatus 100.

In some embodiments, as shown in FIG. 3B, the shield 110 includes different types of conductive slices (e.g., 112a, 112b, 112c, and 112d) which are separately arranged and extend out radially from the center of the plasma-generating chamber 10. For example, one type of conductive slices (e.g., 112a, 112b, and 112c) is of an approximately cuboid shape. In some embodiments, the first type of conductive slices (e.g., 112a, 112b, and 112c) is of different lengths. For example, the facet 112s of the respective conductive slice 112 has a facet length defined by a top edge 1123 and a bottom edge 1124 extending along the second axis A2 and connected to the side edges 1121 and 1122. The facet length may be viewed as the length L of the first type of conductive slices (e.g., 112a, 112b, and 112c). In some embodiments, the first type of conductive slices (e.g., 112a, 112b, and 112c) is of varying lengths. For example, the conductive slice 112a located at the top of the shield 110 is shorter than the conductive slice 112b located at the middle of the shield 110 and/or shorter than the conductive slice 112c located at the bottom of the shield 110. In other embodiments, the lengths of the first type of conductive slices (e.g., 112a, 112b, and 112c) are substantially the same or similar depending on the product requirements. It should be noted that the lengths L of the conductive slices 112 depend on the product requirement and construe no limitation in the disclosure.

In some embodiments, the shield 110 includes another type of conductive slices (e.g., 112d). For example, the respective conductive slice 112d is of a cuboid shape having a recess. For example, the respective conductive slice 112d includes the elongated facet 112s proximal to the exterior wall 10w of the plasma-generating chamber 10 and more than one discrete facet 112s distal to the exterior wall 10w of the plasma-generating chamber 10. In some embodiments, the elongated facet 112s and the discrete facets 112s of the respective conductive slice 112d are opposite to one another and the facet width of the elongated facet 112s may be substantially equal to the facet widths of the discrete facets 112s. Alternatively, the facet width of the elongated facet 112s is different from the facet widths of the discrete facets 112s. For example, the facet width of the elongated facet 112s proximal to the exterior wall 10w of the plasma-generating chamber 10 is greater than the facet widths of the respective discrete facets 112s distal to the exterior wall 10w of the plasma-generating chamber 10. For example, the top surface or the bottom surface of the second type of conductive slice 112d is formed in the shape of a trapezoid which is tapered in a direction away from the exterior wall 10w of the plasma-generating chamber 10. Alternatively, the facet width of the respective discrete facet 112s distal to the exterior wall 10w of the plasma-generating chamber 10 is greater than the facet width of the elongated facet 112s proximal to the exterior wall 10w of the plasma-generating chamber 10. For example, the top surface or the bottom surface of the respective conductive slice 112d is formed in the shape of a trapezoid which is tapered toward the exterior wall 10w of the plasma-generating chamber 10. The top surface or the bottom surface of the respective conductive slice 112d may be tapered toward the same direction to the top surface or the bottom surface of the first type of the conductive slices (e.g., 112a, 112b, and 112c). In other embodiments, the top surface or the bottom surface of the respective conductive slice 112d may be tapered toward the opposing direction to the top surface or the bottom surface of the first type of the conductive slices (e.g., 112a, 112b, and 112c).

In some embodiments, the first type of the conductive slices (112a, 112b, and 112c) and the second type of the conductive slice 112d are of the same or similar thickness to facilitate producing a uniform magnetic field. The respective conductive slice 112d may include an upper portion, a lower portion, and a middle portion connected to the upper portion and the lower portion. The upper portion of the respective conductive slice 112d may have the same or similar shape(s) to the conductive slice 112a located at the top of the shield 110, and the lower portion of the respective conductive slice 112d may have the same or similar shape to the conductive slice 112c located at the bottom of the shield 110. The middle portion of the respective conductive slice 112d may be longer than the conductive slice 112b located at the middle of the shield 110. In some embodiments, the conductive slices (112a, 112b, and 112c) are separately arranged along the first axis A1, and the total length of the respective conductive slice 112d is greater than the total length of the conductive slices (112a, 112b, and 112c). The total length of the conductive slice 112d may be considered as the height of the shield 110.

In some embodiments, the conductive slice 112d may be configured to adjoin with the conductive slices (112a, 112b, and 112c). For example, the conductive slice 112d is substantially parallel to the conductive slices (112a, 112b, and 112c) which are discontinuously and vertically arranged. In an embodiment, the first type and the second type of the conductive slices 112 are alternately arranged along the circumference of the plasma-generating chamber 10. In some embodiments, a group of the first types of the conductive slices 112 and a group of the second types of the conductive slices are configured in a repetitive arrangement, where the group of first types of the conductive slices includes the conductive slices (e.g., 112a located at the top of the shield, 112b located at the middle of the shield, and 112c located at the bottom of the shield) separately arranged along the circumference of the plasma-generating chamber 10, and the group of the second type of the conductive slices includes the conductive slices 112d separately arranged along the circumference of the plasma-generating chamber 10. Alternatively, the first type and the second type of the conductive slices 112 are arranged in non-repetitive patterns such as random patterns.

In some embodiments, a width (e.g., W and W') of the first type of the conductive slices (e.g., 112a, 112b, and 112c) is a distance of the side edge 112S extending along a third axis A3, where the third axis A3 is perpendicular to the first axis A1 and the second axis A2. In some embodiments, the conductive slices (e.g., 112a and 112c respectively located at the top and the bottom of the shield 110) are of the same or similar widths W. In some embodiments, the widths W of the conductive slices (112a and 112c) are greater than the width W' of the conductive slice 112b located at the middle of the shield 110. In some embodiments, the widths W of the conductive slices (112a and 112c) correspond to the widths of the upper portion and the lower portion of the conductive slice 112d, and the width W' of the conductive slice 112b corresponds to the width of the middle portion of the conductive slice 112d. It should be noted that the shape of the shield illustrated herein is an example. The shield 110 may include more than two types of conductive slices or may include a single type (e.g., the first type, the second type, or other type) of the conductive slice. In addition, other shapes, sizes, and configurations of the conductive slices are possible as long as the eddy current loss is efficiently diminished in the shield 110.

Continue to FIG. 3A, FIG. 4, and FIG. 5, adjacent conductive slices 112 may be electrically isolated from one another. For example, two adjacent conductive slices 112 are spatially separated from one another. In some embodiment, every adjacent two conductive slices 112 may define therebetween the respective gap G which is defined by the first edge 1121 of one conductive slice 112 and the second edge 1122 of another conductive slice 112. For example, each of the conductive slices 112 separated from any other of the conductive slices 112 may avoid the generation of a large amount of eddy current on the conductive slices 112 so as to diminish the eddy current loss generated by the shield 110. It should be noted that the figures provided herein are not drawn to scale and are for illustrative purposes. In some embodiments, the gap G is less than the thickness T of the respective conductive slice 112. Alternatively, the gap G is greater than or substantially equal to the thickness T of the conductive slice 112.

In some embodiments, the gaps G are low conductivity areas which may restrict the flow of eddy currents in the shield 110. For example, the shield 110 includes a spacer 114 formed in the gaps G to space apart every adjacent two conductive slices 112. The conductive slices 112 may be embedded in the spacer 114, and at least the facets 112s of the conductive slices 112 that face the coil 120 may be exposed by the spacer 114. In some embodiments, the spacer 114 includes a plurality of spacer slices, and the conductive slices 112 and the spacer slices may be alternately arranged. The material of the spacer 114 may be either much less conductive than the conductive slice 112 or may be an insulator. The union of the plurality of conductive slices 112 and the spacer 114 forms the shield 110.

For example, the material of the spacer 114 includes plastic polymer, rubber, epoxy, ceramic, combination of these, any electrically insulating material, or the like. In some embodiments, the adjacent conductive slices 112 are joined by the spacer 114. For example, the spacer 114 includes adhesive material(s) which may be formed of a glue layer, a coated layer, a thin adhering film, or the like. A number of techniques may be employed alone or in conjunction to fabricate the shield 110. For example, the shield 110 may be fabricated by injection molding, three-dimensional (3D) printing, or any suitable techniques. In some embodiments in which injection molding is employed, the conductive slices 112 are pre-formed and inserted in a mold cavity (not shown) with an intended arrangement as mentioned above, and then the material of spacer 114 is injected into the mold cavity to create the final integrated assembly of the shield 110.

In some embodiments, the cavity C1 is formed between the row of the conductive slices 112a at the top of the shield 110 and the row of the conductive slices 112b at the middle of the shield 110. The cavity C2 may be or may not be also formed between the row of the conductive slices 112c at the bottom of the shield 110 and the row of the conductive slices 112b at the middle of the shield 110. The cavity (e.g., C1 and/or C2) may be air cavity or may be filled by an insulator. In other embodiments, the gap G and the cavities (C1 and C2) between any adjacent conductive slices (e.g., 112a, 112b, 112c, and 112d) are filled by the spacer 114 to create the shield 110 with integral outer surface.

In certain embodiments in which the shield 110 having the cylindrical shape is surrounded by the coil 120, the shield 110 may have an inner diameter Di that is large enough to process a semiconductor workpiece (e.g., a semiconductor wafer having about 300 mm diameters or having other dimension). The shield including conductive slices discontinuously arranged may be applied to an induced coupled plasma (ICP) tool or a transformer coupled plasma (TCP) reactor which is not limited thereto. It should be noted that the number, the shape, and the size of conductive slices 112 and the spacer 114 may be varied to accommodate different process requirements. The shield shown herein is provided as an example and variations thereof may be carried out while still remaining within the scope of the disclosure.

Figure 6:
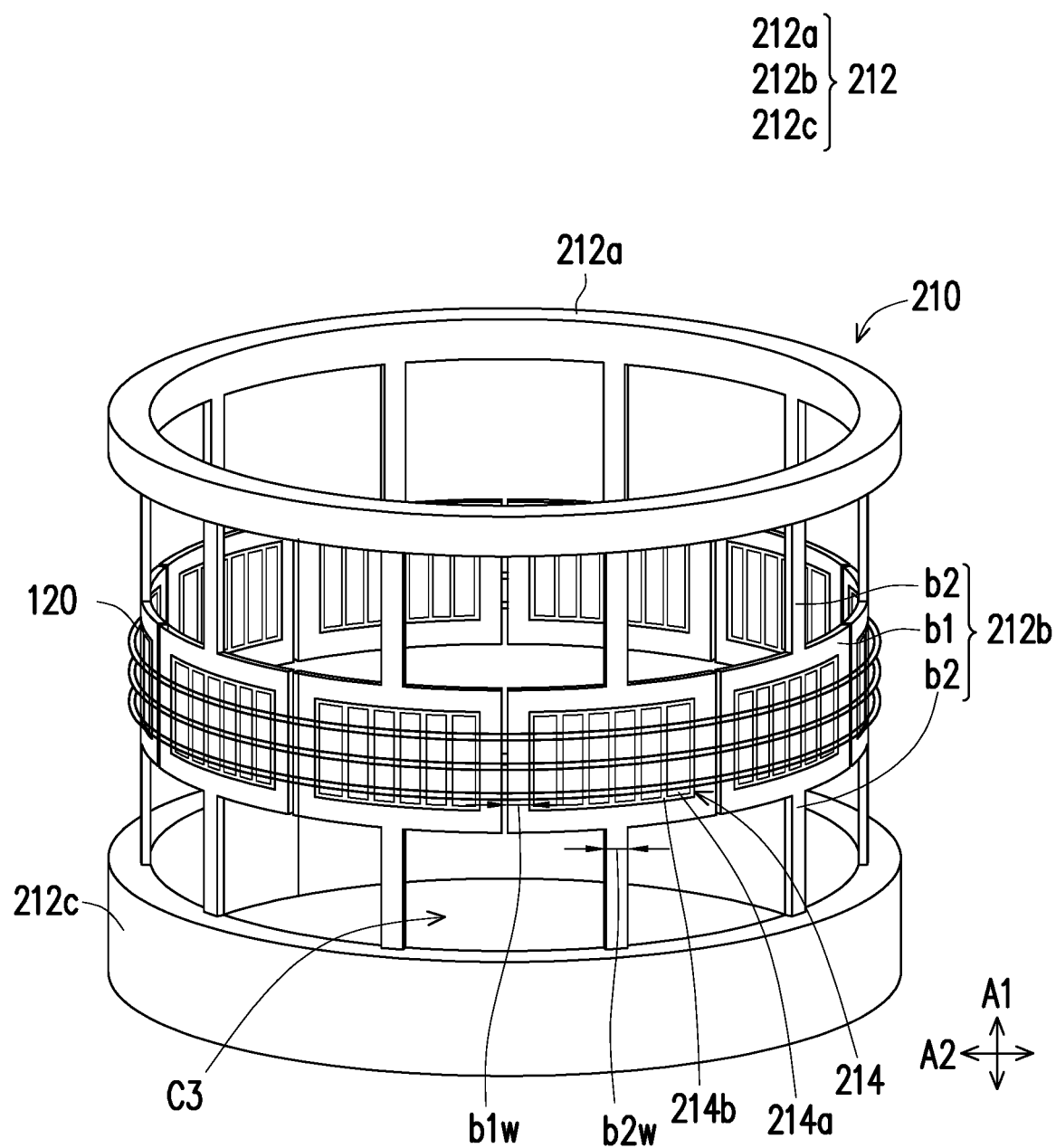
FIG. 6 is a schematic perspective view illustrating a shield of a semiconductor processing apparatus according to some embodiments of the present disclosure.
Figure 7:
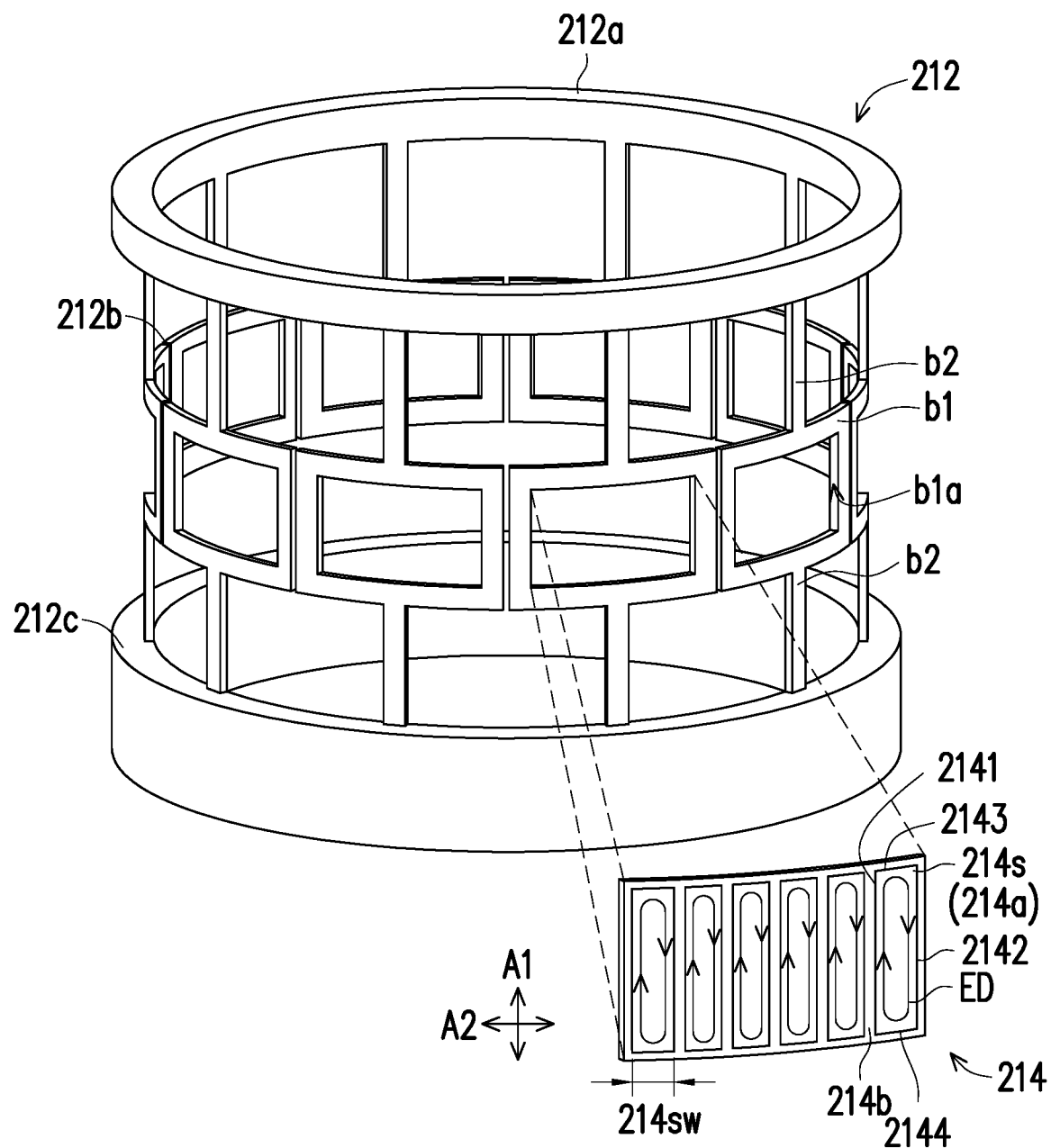
FIG. 7 is a schematic view illustrating a shield including a casing and a block before assembled according to some embodiments of the present disclosure.

FIG. 6 is a schematic perspective view illustrating a shield of a semiconductor processing apparatus according to some embodiments of the present disclosure and FIG. 7 is a schematic view illustrating a shield including a casing and a block before assembled according to some embodiments of the present disclosure.

Referring to FIG. 6 and FIG. 7, a shield 210 adapted to be surrounded by the coil of the semiconductor processing apparatus is provided. The configuration of the shield 210 in the semiconductor processing apparatus may be similar to the shield 110 of the semiconductor processing apparatus 100 as described above, so the detailed description is omitted for brevity. The shield 210 may be referred to as a Faraday shield which plays an important role in improving the RF power efficiency for the semiconductor processing apparatus. For example, the shield 210 is designed to suppress or diminish eddy currents so as to avoid the shield 210 from generating eddy current losses.

In some embodiments, the shield 210 includes a casing 212 and a plurality of blocks 214 embedded in the casing 212. For example, the casing 212 includes an upper portion 212a, a lower portion 212c, and a plurality of middle portions 212b respectively connected to the upper portion 212a and the lower portion 212c. In some embodiments, the upper portion 212a and the lower portion 212c are circular in shape, and the middle portions 212b are separately oriented along the circumferences of the upper portion 212a and the lower portion 212c. Alternatively, the upper portion 212a and the lower portion 212c may be any shape such as circular, square, rectangular, oval, etc. The upper portion 212a and the lower portion 212c includes the same or similar conductive material including aluminum, iron, copper, silicon steel sheet, silver, gold, platinum, metallic alloys, combination of these, etc.

In some embodiments, the middle portions 212b are separately distributed around the middle of the shield 210. For example, adjacent two of the middle portions 212b are spatially apart from one another by a gap C3. The gaps C3 may be air gaps or filled by an insulator (not shown). In an embodiment, the respective gap C3 is formed as an approximately I-shaped gap between adjacent two of the middle portions 212b. The shape of the respective gap C3 may depend on the shape of the adjacent middle portions 212b, which is not limited thereto. In some embodiments, the coil 120 is wound around the middle portions 212b of the shield 210. For example, each of the middle portions 212b includes a middle frame b1 and at least two posts b2 respectively extending to be connected to the upper portion 212a and the lower portion 212c. The middle frames b1 of the middle portions 212b may be surrounded by the coil 120. The middle frame b1 and the posts b2 may be integratedly formed and may include the same or similar conductive material including aluminum, iron, copper, silicon steel sheet, silver, gold, platinum, metallic alloys, combination of these, etc.

In some embodiments, one of the post b2 of the respective middle portion 212b is connected to the upper middle edge of the middle frame b1 and the upper portion 212a, and the other one of the post b2 of the respective middle portion 212b is connected to the lower middle edge of the middle frame b1 and the lower portion 212c. In other embodiments, more than two posts b2 are distributed at the upper edge (and/or the lower edge) of the middle frame b1. In some embodiments, the width b1w of the middle frame b1 is substantially the same or similar to the width b2w of the respective posts b2. Alternatively, the width b1w of the middle frame b1 is greater than or less than the width b2w of the respective posts b2. The width b1w of the middle frame b1 and the width b2w of the respective posts b2 are designed to suppress or minimize eddy currents within the shield 210. It should be noted that the number and the shape of the respective post b2 construe no limitation in the disclosure as long as the posts b2 can provide support to the middle frame b1 for connecting the upper portion 212a and the lower portion 212c.

The middle frame b1 may be provided with a window opening b1a. In some embodiments, the middle frame b1 is a substantially rectangular middle frame with a hollow central section. It should be noted that the shape of each middle frame b1 of the respective middle portion 212b is not necessarily limited to rectangular, circular, elliptical, triangular, polygonal, or the like. In some embodiments, each of the plurality of blocks 214 is held in place within one of the window openings b1a of the respective middle frame b1 of the middle portions 212b. For example, the respective block 214 is complimentary in shape to the corresponding window opening b1a of the middle frame b1.

In some embodiments, each of the blocks 214 includes a plurality of conductive slices 214a discontinuously arranged aside one another. The conductive slices 214a may be separately arranged along a winding direction of the coil 120 and overlap with the coil 120. For example, the conductive slices 214a are spaced and longitudinally extending segments surrounded by the coil 120. The respective slice may be formed in the shape of a rectangular (or square). For example, the conductive slices 214a are arranged side by side with a gap, and the respective conductive slice 214a extends along the first axis A1 perpendicular to the second axis A2 in which the coil 120 is wound. The conductive slices 214a may be any material or combination of materials provided which are conductive, such as aluminum, iron, copper, silicon steel sheet, silver, gold, platinum, metallic alloys, combination of these, or the like. In some embodiments, each of the conductive slices 214a has a facet 214s facing the coil 120, and a facet width 214sw of the facet 214s may be defined by two side edges (2141 and 2142) extending along the first axis A1.

In some embodiments, the facet width 214sw of the respective conductive slice 214a is substantially the same or similar to the width b1w of the middle frame b1. Alternatively, the width b1w of the middle frame b1 is greater than or less than the facet width 214sw of the conductive slices 214a. In some embodiments, the facet widths 214sw of the conductive slices 214a are substantially uniform. For example, the facet width 214sw of the respective conductive slice 214a ranges from about 0.01 mm to about 10 mm. It should be noted that the facet widths 214sw of the conductive slices 214a may be adjusted depending on the technique (s) that is employed to fabricate the shield 210 and the process requirements of the semiconductor processing apparatus. The number of conductive slices, slice shapes, and slice sizes of the blocks may be varied as necessary to accommodate different semiconductor processing requirements.

In some embodiments, during operation, each of the conductive slices 214a including the side edges (2141 and 2142) forms therebetween an eddy current as indicated by arrow ED in FIG. 7. It is understood that the eddy current losses of the shield 210 are proportional to the square of the facet width 214sw of the conductive slices 214a. By dividing the middle portions 212b of the shield 210 into multiple blocks 214 having sliced conductive material in the window openings b1a of the middle frame b1, eddy current losses generated in the shield 210 by the RF power emitted by the coil 120 may be minimized, thereby efficiently generating the magnetic fields and enhancing the RF power efficiency. The improved RF power efficiency may generate the plasma with higher density, thereby increasing the productivity and the yield of the semiconductor manufacturing process.

In some embodiments, the respective block 214 includes a spacer 214b disposed between adjacent conductive slices 214a. In some embodiments, the spacers 214b of the blocks 214 are made of material(s) which is much less conductive than the conductive slices 214a to restrict the flow of eddy currents in the middle portions 212b of the shield 110. In some embodiments, the spacer 214b includes plastic polymer, rubber, epoxy, ceramic, and combination of these or any electrically insulating material that may electrically isolate the conductive slices 214a from one another. In some embodiments, the respective conductive slice 214a is surrounded by the spacer 214b. For example, the conductive slices 214a are embedded in the spacer 214b, and at least the facets 214s of the conductive slices 214a that face the coil 120 may be exposed by the spacer 214b. The width of a portion of the spacer 214b between adjacent two of the conductive slices 214a may be less than the facet width 214sw of the respective conductive slice 214a. In other embodiments, the width of a portion of the spacer 214b between adjacent conductive slices 214a is substantially equal to or greater than the facet width 214sw of the respective conductive slice 214a.

For example, the spacer 214b at least covers the side edges (2141 and 2142) of the respective conductive slice 214a. In some embodiments, the top and bottom edges (2143 and 2144) connected to the side edges (2141 and 2142) are also covered by the spacer 214*b* so that the conductive slices 214*a* inserted into the window openings b1*a* is spaced apart from the corresponding middle frame b1. In an embodiment in which the spacer 214*b* is made of an electrically insulating material, the conductive slices 214*a* of the respective block 214 is electrically isolated from the corresponding middle frame b1. In some embodiments, the spacer 214*b* is formed with a uniform width. In an embodiments, a portion of the spacer 214*b* between the side edges of adjacent conductive slices 214*a* is narrower than a portion of the spacer between the top edge (or the bottom edge) of the respective conductive slice 214*a* and the middle frame b1. Alternatively, a portion of the spacer 214*b* between the side edges of adjacent conductive slices 214*a* is wider than a portion of the spacer between the top edge (or the bottom edge) of the respective conductive slice 214*a* and the middle frame b1.

In some embodiments, the adjacent conductive slices 214*a* are joined by the spacer 214*b*. For example, the spacer 214*b* includes adhesive material(s) which may be formed of a glue layer, a coated layer, a thin adhering film, or the like. The material, the shape, and the size of the spacer may be varied as necessary to accommodate different semiconductor processing requirements. In some embodiments, the casing 212 and the blocks 214 are separately formed. The window openings b1*a* of the middle frames b1 may be formed of a shape substantially complementary to the shape of the block 214. It should be noted that only one block 214 is shown in FIG. 7 for illustrative purposes. Once assembled, the respective block 214 is fit into the corresponding window opening b1*a* of the middle frame b1, and the facets 214*s* of the conductive slices 214*a* exposed by the spacer 214*b* may face an inner peripheral surface of the coil 120. In certain embodiments in which the spacer 214*b* of the respective block 214 includes adhesive material(s) and wrapping around at least the edges of the conductive slices 214*a*, so that the respective block 214 may be adhered to the middle frame b1 through the spacer 214*b*. It should be noted that the block 214 and the casing 212 of the shield 210 shown in FIG. 7 is an illustrative examples and should not be considered as limiting to the disclosure.

Figure 8:
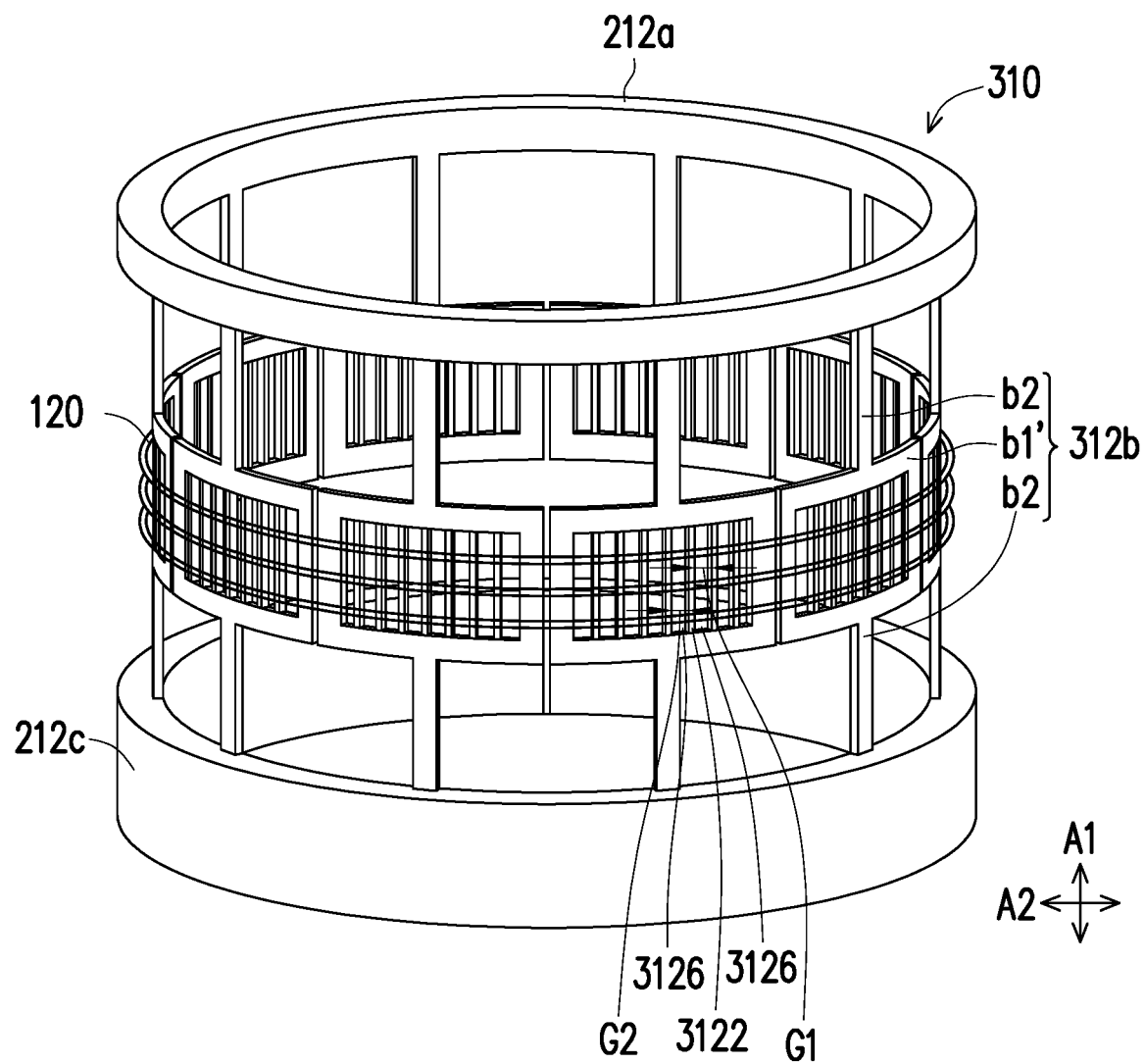
FIG. 8 is a schematic perspective view illustrating a shield of a semiconductor processing apparatus according to some embodiments of the present disclosure.

FIG. 8 is a schematic perspective view illustrating a shield of a semiconductor processing apparatus according to some embodiments of the present disclosure. Referring to FIG. 8 and also with reference to FIG. 6, a shield 310 adapted to be surrounded by the coil of the semiconductor processing apparatus is provided. The shield 310 may be referred to as a Faraday shield which plays an important role in improving the RF power efficiency for the semiconductor processing apparatus. For example, the shield 310 is designed to suppress or diminish eddy currents so as to avoid the shield 310 from generating eddy current losses. The shield 310 in the semiconductor processing apparatus may be similar to the shield 210 described in FIG. 6, so the detailed description is omitted for brevity. The difference between the shields 210 and 310 includes the configuration of the middle portion 312*b*.

For example, a plurality of middle portions 312*b* is respectively connected to the upper portion 212*a* and the lower portion 212*c*. In some embodiments, the middle portions 312*b* are separately distributed around the middle of the shield 310. For example, adjacent two of the middle portions 312*b* are spatially apart from one another by the gap C3. The gaps C3 may be air gaps or filled by an insulator (not shown). In an embodiment, the respective gap C3 is formed as an approximately I-shaped gap between adjacent two of the middle portions 312*b*. The shape of the respective gap C3 may depend on the shape of the adjacent middle portions 312*b*, which is not limited thereto. In some embodiments, the coil 120 is wound around the middle portions 312*b* of the shield 310. For example, each of the middle portions 312*b* includes a middle frame b1' and at least two posts b2 respectively extending to be connected to the upper portion 212*a* and the lower portion 212*c*. The middle frames b1' of the middle portions 312*b* may be surrounded by the coil 120. The middle frame b1' and the posts b2 may be integratedly formed and may include the same or similar conductive material including aluminum, iron, copper, silicon steel sheet, silver, gold, platinum, metallic alloys, combination of these, etc.

In some embodiments, the respective middle frame b1' is provided with a plurality of conductive slices 3122 separately arranged along the widthwise direction (i.e. the second axis A2). For example, the respective conductive slice 3122 extends along in the lengthwise direction (i.e. the first axis A1). The conductive slices 3122 may be made of the same or similar conductive material as the middle frame b1'. For example, the conductive slices 3122 are integratedly formed with or secured to the middle frame b1'. In some embodiments, the conductive slices 3122 have the uniform dimension. In other embodiments, the conductive slices are of different dimensions as will be described later. It should be noted that the shapes of middle frame and the conductive slices are not necessarily limited to rectangular, circular, elliptical, triangular, polygonal, or the like. In some other embodiments, a single conductive slice 3122 is disposed on the middle frame b1'. It is also noted that the numbers of the conductive slices 3122 illustrated in FIG. 8 is merely an example and construe no limitation in the disclosure.

In some embodiments, the middle frame b1' and the conductive slice 3122 adjacent to the middle frame b1' may be spaced apart from each other by a gap G1. The neighboring conductive slices 3122 may be spaced apart from one another by a gap G2. In some embodiments, the conductive slices 3122 are evenly distributed by the uniform gaps G1 and G2. In some other embodiments, the dimension of the gap G1 is greater than or less than that of the gap G2. In some embodiments, the spacer 3126 fills the gaps G1 and G2 to laterally separate the neighboring conductive slices 3122 from one another and also separate the conductive slices 3122 from the middle frame b1'. For example, the spacer 3126 includes plastic polymer, rubber, epoxy, ceramic, combination of these, or other suitable electrically insulating material. Again, the configuration of the middle portion 312*b* illustrated in FIG. 8 is merely an example and may be adjusted depending on the product and process requirements.

Figure 9:
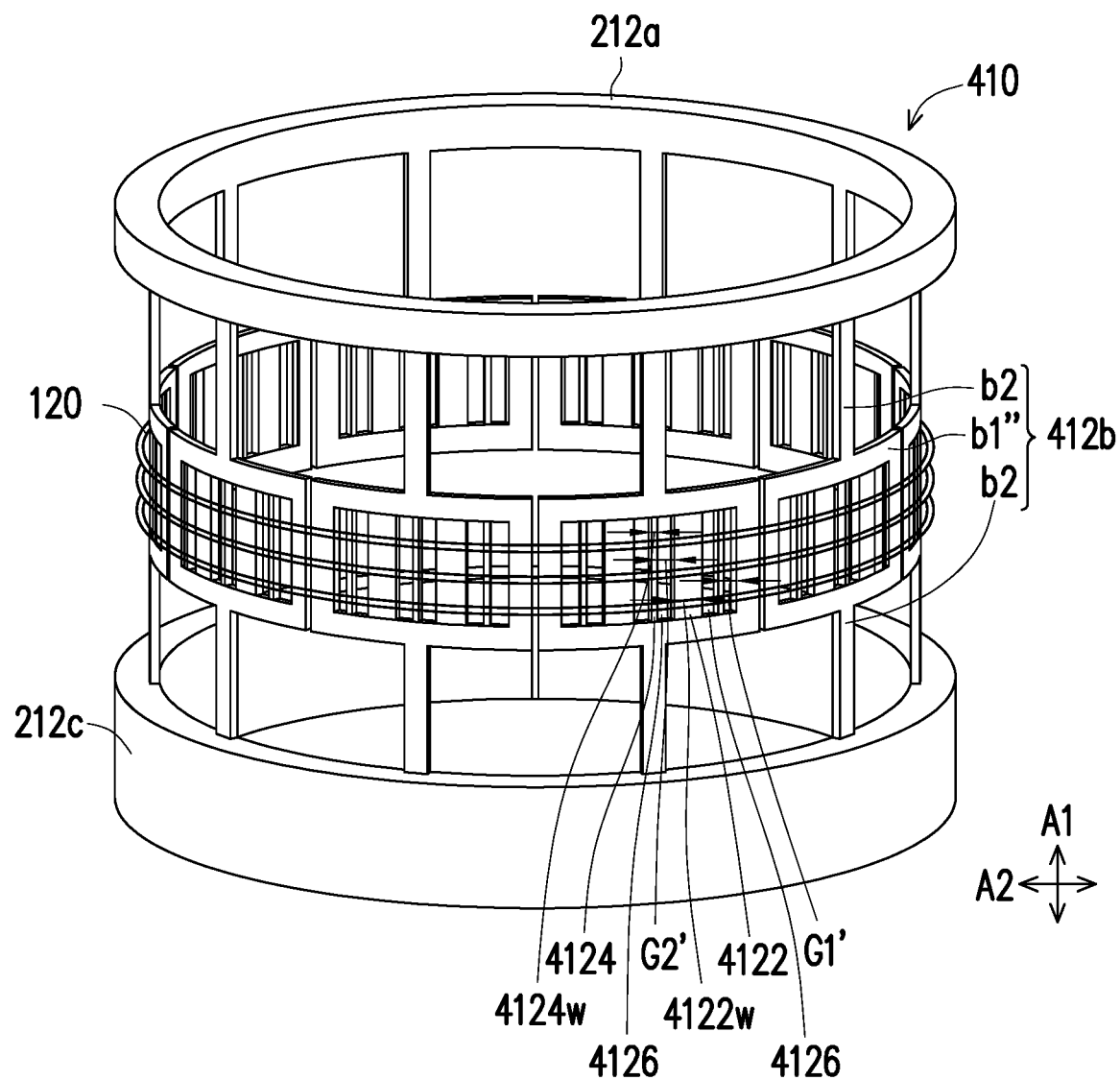
FIG. 9 is a schematic perspective view illustrating a shield of a semiconductor processing apparatus according to some embodiments of the present disclosure.

FIG. 9 is a schematic perspective view illustrating a shield of a semiconductor processing apparatus according to some embodiments of the present disclosure. Referring to FIG. 9 and also with reference to FIG. 8, a shield 410 adapted to be surrounded by the coil of the semiconductor processing apparatus is provided. The shield 410 may be referred to as a Faraday shield which plays an important role in improving the RF power efficiency for the semiconductor processing apparatus. For example, the shield 410 is designed to suppress or diminish eddy currents so as to avoid the shield 310 from generating eddy current losses. The shield 410 in the semiconductor processing apparatus may be similar to the shield 310 described in FIG. 8, so the detailed description is omitted for brevity. The difference between the shields 310 and 410 includes the configuration of the middle portion 412*b*.

The middle frames b1" of the middle portions 412b may be surrounded by the coil 120. The middle frame b1" and the posts b2 may be integratedly formed and may include the same or similar conductive material including aluminum, iron, copper, silicon steel sheet, silver, gold, platinum, metallic alloys, combination of these, etc. In some embodiments, the respective middle frame b1" is provided with a plurality of first conductive slices 4122 and a plurality of second conductive slices 4124 alternately and separately arranged along the widthwise direction (i.e. the second axis A2). For example, the respective first conductive slice 4122 and the respective second conductive slice 4124 extend along in the lengthwise direction (i.e. the first axis A1). The first conductive slices 4122 and the second conductive slices 4124 may be made of the same or similar conductive material as the middle frame b1'. For example, the first conductive slices 4122 and the second conductive slices 4124 are integratedly formed with or secured to the middle frame b1".

In some embodiments, the first conductive slices 4122 and the second conductive slices 4124 have the same or similar lengths, while the widths 4122w of the first conductive slices 4122 are greater than the widths 4124w of the second conductive slices 4124. In other embodiments, the widths 4122w of the first conductive slices 4122 are substantially equal to or less than the widths 4124w of the second conductive slices 4124. It should be noted that the shapes of middle frame and the conductive slices are not necessarily limited to rectangular, circular, elliptical, triangular, polygonal, or the like. In some other embodiments, a single first conductive slice 4122 and a single second conductive slice 4124 may be separately disposed on the middle frame b1'. It is also noted that the numbers of the first conductive slices 4122 and the second conductive slices 4124 illustrated in FIG. 9 is merely an example and construe no limitation in the disclosure.

The middle frame b1" and the second conductive slice 4124 adjacent to the middle frame b1" may be spaced apart from each other by a gap G1', and the first conductive slice 4122 and the second conductive slice 4124 adjacent to the first conductive slice 4122 may be spaced apart from each other by a gap G2'. In some embodiments, the dimension of the gap G1' is greater than or substantially equal to that of the gap G2'. Alternatively, the dimension of the gap G1' is less than that of the gap G2'. The gaps G1' between the middle frames b1" and the second conductive slices 4124 may vary from one area to another. The gaps G2' between the first conductive slices 4122 and the second conductive slices 4124 may also vary from one area to another. In some embodiments, the spacer 4126 fills the gaps G2' to laterally separate the first conductive slice 4122 from the adjacent second conductive slice 4124. The spacer 4126 may also fill the gaps G1' between the middle frames b1' and the second conductive slices 4124. The material of the spacer 4126 may be similar to the spacer 3126 described in FIG. 8. In some embodiments, the first conductive slices 4122 are disposed aside the middle frame b1", and the middle frame b1" and the first conductive slice 4122 adjacent to the middle frame b1" may be spaced apart from each other by a gap. Under such scenario, the spacer 4126 may fill the gaps between the middle frames b1' and the first conductive slices 4122. Again, the configuration of the middle portion 412b illustrated in FIG. 9 is merely an example and may be adjusted depending on the product and process requirements.

Figure 10:
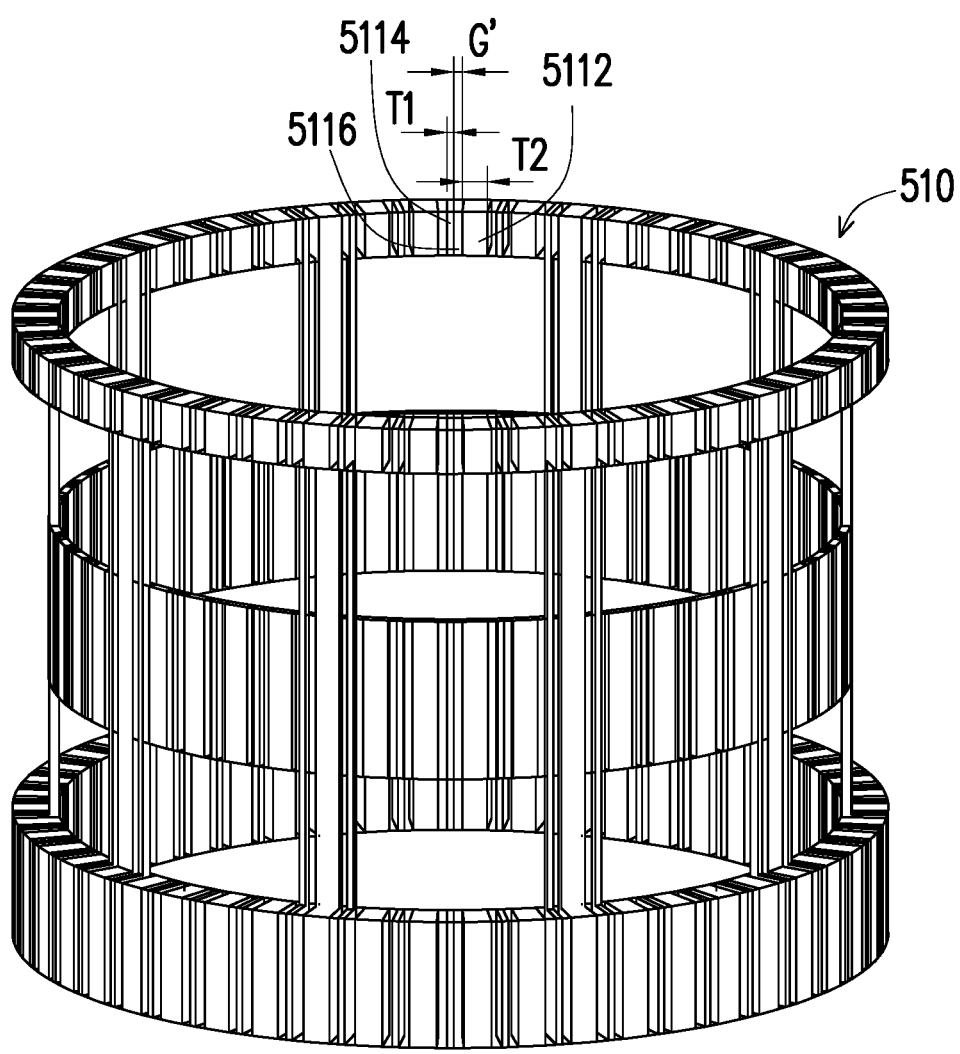
FIG. 10 is a schematic perspective view illustrating a shield of a semiconductor processing apparatus according to some embodiments of the present disclosure.

FIG. 10 is a schematic perspective view illustrating a shield of a semiconductor processing apparatus according to some embodiments of the present disclosure. Referring to FIG. 10 and also with reference to FIG. 3A, a shield 510 including a plurality of first conductive slices 5112 and a plurality of second conductive slices 5114 separately and alternately arranged is provided. The shield 510 may be similar to the shield 110 described in FIG. 3A, so the detailed descriptions are not repeated for the sake of brevity. The difference between the shields 510 and 110 includes that the thickness of the respective first conductive slice 5112 is different from that of the thickness of the respective second conductive slice 5114.

For example, the thickness T1 of the respective first conductive slice 5112 is greater than the thickness T2 of the respective second conductive slice 5114. In some embodiments, the thickness T1 of the first conductive slice 5112 is a few times or a hundred times greater than the thickness T2 of the second conductive slice 5114. Alternatively, the thickness T1 of the first conductive slice 5112 may be a thousand times greater than the thickness T2 of the second conductive slice 5114. It is noted that the dimensions of the first conductive slice 5112 and the second conductive slice 5114 may vary depending on the product and process requirements. In some embodiments, a gap G' is formed between the neighboring first conductive slice 5112 and second conductive slice 5114. For example, the first conductive slices 5112 and the second conductive slices 5114 are spaced apart from one another by the uniform gaps G'. In some embodiments, the gaps G' vary from one area to another along the circumference of the plasma-generating chamber 10.

In some embodiments, the spacer 5116 is formed in the gaps G' to physically separate the neighboring first conductive slice 5112 and second conductive slice 5114. In some embodiments, the first conductive slices 5112 and the second conductive slices 5114 are embedded in the spacer 5116, and at least the facets of the respective first conductive slice 5112 and the respective second conductive slice 5114 that face the coil may be exposed by the spacer 5116. In some embodiments, the spacer 5116 includes a plurality of spacer slices, and the conductive slices (e.g., 5112 and 5114) and the spacer slices are alternately arranged. The material of the spacer 5116 may be either much less conductive than the conductive slice or may be an insulator. In some embodiments, the material of the spacer 5116 is similar to the spacer 114 described in FIG. 3A. A number of techniques may be employed alone or in conjunction to fabricate the shield 510. For example, the shield 510 may be fabricated by injection molding, three-dimensional (3D) printing, or any suitable techniques. The union of the first conductive slices 5112, the second conductive slices 5114, and the spacer 5116 forms the shield 510.

According to some embodiments, a Faraday shield is provided. The Faraday shield includes a plurality of conductive slices and a spacer interposed between adjacent two of the conductive slices to electrically isolate the adjacent two of the conductive slices from one another. The conductive slices are separately arranged aside one another and oriented along a circumference of the Faraday shield. A coil is wound around the circumference of the Faraday shield.

According to some alternative embodiments, a semiconductor processing apparatus is provided. The semiconductor processing apparatus includes a plasma-generating chamber adapted to generate plasma therein, a coil surrounding the plasma-generating chamber and coupled to a power source, and a shield interposed between the coil and the plasma-generating chamber. The shield includes a plurality of conductive slices discontinuously arranged along an exterior wall of the plasma-generating chamber.

According to some alternative embodiments, an etching apparatus is provided. The etching apparatus includes a plasma-generating chamber adapted to generate plasma therein, a processing chamber disposed below the plasma-generating chamber and adapted to process a semiconductor workpiece, a shield disposed on an exterior wall of the plasma-generating chamber, and a coil coupled to a power source to supply a plasma-creating power. The shield includes a plurality of conductive slices arranged parallel to one another along the exterior wall of the plasma-generating chamber. The coil is wound around the conductive slices of the shield.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor processing apparatus, comprising:
   a plasma-generating chamber adapted to generate plasma therein;
   a coil surrounding the plasma-generating chamber and coupled to a power source; and
   a shield interposed between the coil and the plasma-generating chamber and comprising a plurality of conductive slices discontinuously arranged along an exterior wall of the plasma-generating chamber, wherein the plurality of conductive slices of the shield comprises:
      a first slice comprising a first portion and a second portion physically connected to the first portion and disposed below the first portion in a height direction of the shield, wherein the first portion protrudes outward greater than the second portion, relative to the exterior wall of the plasma-generating chamber; and
      a second slice disposed alongside the first slice along a circumference of the shield and comprising a third portion and a fourth portion disposed below the third portion in the height direction of the shield and physically separated from the third portion.

2. The semiconductor processing apparatus of claim 1, wherein the shield further comprises:
   a spacer interposed between and electrically isolating adjacent two of the plurality of conductive slices from one another.

3. The semiconductor processing apparatus of claim 2, wherein the spacer comprises an adhesive material to adhere the adjacent two of the plurality of conductive slices.

4. The semiconductor processing apparatus of claim 2, wherein the spacer comprises:
   a first portion adhering the first portion of the first slice to the third portion of the second slice; and
   a second portion adhering the second portion of the first slice to the fourth portion of the second slice, and the first and second portions of the spacer are physically separated from one another.

5. The semiconductor processing apparatus of claim 2, wherein the first slice comprises a facet facing the coil and exposed by the spacer.

6. The semiconductor processing apparatus of claim 1, wherein a size of the first portion of the first slice is substantially equal to that of the third portion of the second slice.

7. The semiconductor processing apparatus of claim 1, wherein a top surface or a bottom surface of each of the plurality of conductive slices of the shield is in the shape of a trapezoid.

8. An etching apparatus, comprising:
   a plasma-generating chamber adapted to generate plasma therein;
   a processing chamber disposed below the plasma-generating chamber and adapted to process a semiconductor workpiece;
   a shield disposed on an exterior wall of the plasma-generating chamber and comprising a plurality of conductive slices arranged parallel to one another along the exterior wall of the plasma-generating chamber; and
   a coil wound around the plurality of conductive slices of the shield and coupled to a power source to supply a plasma-creating power, wherein the plurality of conductive slices comprises a plurality of first slices and a plurality of second slices, a respective first slice of the plurality of first slices has a first portion and a second portion disposed directly below and connected with the first portion in a lengthwise direction of the respective first slice, a width of the first portion along a widthwise direction of the respective first slice is greater than a width of the second portion along the widthwise direction, the lengthwise direction of the respective first slice is a height direction of the shield, the widthwise direction is measured between opposing facets of the respective first slice which are respectively proximal to and distal to the exterior wall of the plasma-generating chamber, the plurality of second slices are arranged aside the plurality of first slices, and a respective second slice of the plurality of second slices has a third portion and a fourth portion disposed below the third portion in the height direction of the shield and physically separated from the third portion.

9. The etching apparatus of claim 8, wherein the shield further comprises:
   an insulating spacer interposed between adjacent two of the plurality of conductive slices to electrically isolate the adjacent two of the plurality of conductive slices from one another.

10. The etching apparatus of claim 9, wherein the insulating spacer comprises an adhesive material to adhere adjacent two of the plurality of conductive slices.

11. The etching apparatus of claim 8, wherein a recess adjoining one of the opposing facets of the second portion which is distal to the exterior wall of the plasma-generating chamber is directly below the first portion in the height direction of the shield.

12. The etching apparatus of claim 8, wherein the respective first slice has a C-shaped cross-sectional view.

13. The etching apparatus of claim 12, wherein the first portion is an upper portion or a lower portion of each of the plurality of first slices, and the second portion is a middle portion of each of the plurality of first slices.

14. The etching apparatus of claim 8, wherein each of the plurality of first slices has a length along the height direction of the shield greater than a total length of the plurality of second slices along the height direction of the shield.

15. A semiconductor processing apparatus, comprising:
a plasma-generating chamber adapted to generate plasma therein;
a shield disposed on an exterior wall of the plasma-generating chamber and comprising:
  a plurality of conductive slices separately arranged aside one another and oriented along a circumference of the plasma-generating chamber, wherein a gap is between side surfaces of adjacent two of the plurality of conductive slices; and
  a spacer interposed between adjacent two of the plurality of conductive slices to electrically isolate the adjacent two of the plurality of conductive slices from one another; and
a coil wound around the circumference of the shield, wherein the plurality of conductive slices comprises a plurality of first slices and a plurality of second slices, a respective first slice of the plurality of first slices has a first portion and a second portion disposed below the first portion in a height direction of the shield, the first portion comprises opposing facets which are respectively proximal to and distal to the exterior wall of the plasma-generating chamber, a thickness of each of the opposing facets is less than a lateral dimension of the gap, the thicknesses of the opposing facets are substantially equal, and a respective second slice of the plurality of second slices has a third portion and a fourth portion disposed below the third portion in the height direction of the shield and physically separated from the third portion.

16. The semiconductor processing apparatus of claim 15, wherein
  the respective second slice of the plurality of second slices has a length along the height direction of the shield less than a length of the plurality of first slices along the height direction of the shield.

17. The semiconductor processing apparatus of claim 15, wherein the adjacent two of the plurality of conductive slices are adhered to one another through the spacer.

18. The semiconductor processing apparatus of claim 15, wherein the first portion protrudes outward greater than the second portion, relative to the exterior wall of the plasma-generating chamber.

19. The semiconductor processing apparatus of claim 15, wherein the opposing faces are exposed by the spacer.

20. The semiconductor processing apparatus of claim 15, wherein each of the plurality of first slices further has a fifth portion disposed below and connected with the second portion in the height direction of the shield.

* * * * *